United States Patent
Diorio et al.

(10) Patent No.: US 7,071,507 B2
(45) Date of Patent: Jul. 4, 2006

(54) HIGH-VOLTAGE CMOS-COMPATIBLE CAPACITORS

(75) Inventors: Christopher J. Diorio, Shoreline, WA (US); Frederic J. Bernard, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 10/931,583

(22) Filed: Sep. 1, 2004

(65) Prior Publication Data

US 2005/0093094 A1 May 5, 2005

Related U.S. Application Data

(62) Division of application No. 10/635,247, filed on Aug. 5, 2003, now Pat. No. 6,842,327.

(51) Int. Cl.
*H01L 27/108* (2006.01)

(52) U.S. Cl. .......................... 257/296; 257/68; 257/71; 257/E21.646

(58) Field of Classification Search .................. None
See application file for complete search history.

(56) References Cited

U.S. PATENT DOCUMENTS

| | | | |
|---|---|---|---|
| 4,914,546 A | 4/1990 | Alter | 361/313 |
| 5,187,637 A | 2/1993 | Embree | 361/313 |
| 5,301,150 A * | 4/1994 | Sullivan et al. | 365/185.08 |
| 5,354,701 A | 10/1994 | Chao | 438/244 |
| 5,587,869 A | 12/1996 | Azumi et al. | 361/301.3 |
| 5,831,692 A | 11/1998 | Lee | 349/38 |
| 5,908,443 A | 6/1999 | Brewer et al. | 607/18 |
| 5,926,064 A | 7/1999 | Hariton | 327/581 |
| 6,137,153 A * | 10/2000 | Le et al. | 257/532 |
| 6,242,989 B1 | 6/2001 | Barber et al. | 331/177 V |
| 6,262,469 B1 | 7/2001 | Le et al. | 257/532 |
| 6,563,691 B1 | 5/2003 | Kijima et al. | 361/328 |
| 6,646,499 B1 | 11/2003 | Tiebout | 327/586 |
| 6,664,909 B1 * | 12/2003 | Hyde et al. | 341/144 |

OTHER PUBLICATIONS

U.S. Appl. No. 10/143,557 Hyde et al., (assignee Impinj), filed May 9, 2002.

* cited by examiner

*Primary Examiner*—Nathan J. Flynn
*Assistant Examiner*—Scott R Wilson
(74) *Attorney, Agent, or Firm*—Merchant & Gould P.C.

(57) ABSTRACT

A high-voltage stacked capacitor includes a first capacitor and a second capacitor. Each capacitor includes a first plate comprising a first semiconductive body and a second plate comprising a floating electrode. The first and second semiconductive bodies are electrically isolated from each other. The floating electrode includes an intercapacitor node configured to self-adjust to a value less than a working voltage impressed on the stacked capacitor.

33 Claims, 5 Drawing Sheets

HIGH-VOLTAGE CMOS-COMPATIBLE CAPACITORS

RELATED APPLICATIONS

This application is a divisional application of U.S. patent application Ser. No. 10/635,247, filed on Aug. 5, 2003 now U.S. Pat. No. 6,842,327, entitled "High-Voltage CMOS-Compatible Capacitors" and naming Chris Diorio and Frederic Bernard as inventors, the disclosure of which is hereby incorporated herein by reference.

TECHNICAL FIELD

This disclosure describes high-voltage capacitors that may be formed using standard complementary metal-dielectric-semiconductor or complementary metal-oxide-semiconductor (CMOS) integrated circuit (IC) processing technology. More particularly, this disclosure describes high-voltage CMOS-compatible capacitors that include stacked metal-dielectric-semiconductor or semiconductor-dielectric-semiconductor floating-gate structures which have simpler ancillary circuit requirements than prior art structures because they include a self-biasing intercapacitor node.

BACKGROUND

FIG. 1 is an exemplary schematic diagram of a capacitor 100 in accordance with the prior art. The capacitor 100 includes a first plate 110, a first electrode 115 coupled to the first plate and permitting interconnection with other circuit elements (not shown in FIG. 1), a second plate 120 together with a second electrode 125 coupled to the second plate 120 and a dielectric 130 disposed between the first 110 and second 120 plates of the capacitor 100. The capacitor 100 operates by storing and releasing charge in response to signals coupled to the first 115 and second 125 electrodes. It is generally desirable to form capacitors 100 together with CMOS circuit elements but without requiring modification of standard CMOS processes. This allows greater choice of foundry for CMOS IC manufacturing, simplifies production, and reduces expense in realizing ICs that include the capacitor 100.

Some applications for capacitors 100 require larger breakdown voltages than are needed for most of the other circuit elements forming the IC. Such applications may include power supplies associated with programming circuitry for programmable or nonvolatile memory elements.

The first 110 and second 120 plates may be realized in a number of forms in ICs using standard CMOS processes. These forms can include metal or semiconductor layers comprising the capacitor plates 110, 120, separated by a layer forming the dielectric 130, or interdigitated conductive patterns comprising the capacitor plates 110, 120.

Capacitors 100 formed using interdigitated conductive patterns for the capacitor plates 110, 120 tend to provide relatively high breakdown voltage. These also tend to be relatively large and to provide relatively little capacitance per unit area of the IC in which they are formed.

Capacitors 100 may also be formed by using a first conductive plate 110, which may be relatively planar, formed on or in a substrate, a relatively planar dielectric 130 disposed atop the first plate 110 and a relatively planar second conductive plate 120 formed on and supported by the dielectric layer 130. The first plate 110 may be formed from metal or from a conductively doped semiconductive layer. When formed on a semiconductive substrate using conventional CMOS processing techniques and employing a dielectric analogous to a FET gate dielectric, such capacitors may be referred to as MOS capacitors or MDS (metal-dielectric-semiconductor) capacitors, although the dielectric may or may not be an oxide or silicon dioxide, and the first 110 and second 120 plates may be semiconductive or other conductive material rather than including metal.

For example, first 110 and second 120 plates may be formed using polysilicon or metal layers separated by a dielectric layer 130 formed using polyimide or an oxide such as silicon dioxide. Such capacitors 100 may be formed to have relatively high breakdown voltage using a relatively thick dielectric layer 130 but then provide relatively little capacitance per unit surface area of the IC because of the thickness of the dielectric layer 130.

Alternatively, MDS structures may be formed either as FETs or as MDS capacitors, using the same material for the dielectric 130 as is used to form gate dielectrics for other FET structures that are also part of the IC. This allows the capacitor 100 to be formed via the same processes that are employed to form transistors and the like. However, gate dielectrics are typically made relatively thin because, among other things, the transconductance of a FET per unit gate width (i.e., per unit area of the IC) decreases as the gate dielectric thickness increases. As a result, while use of dielectric layers 130 that are also suitable for FET gate structures provides relatively high capacitance per unit area, the breakdown voltage of the resulting capacitor 100 is relatively low.

Various prior art capacitors have been employed to address these conflicting aspects of high-voltage capacitor realization. For example, U.S. Pat. No. 5,187,637, entitled "Monolithic High-Voltage Capacitor" and issued to Embree describes a capacitor employing multiple dielectric layers and a guard ring but requires process steps not normally associated with CMOS IC fabrication, while U.S. Pat. No. 5,587,869 entitled "High-Voltage Capacitor Manufacturing Method And High-Voltage Capacitor" and issued to Azumi et al. describes a high-voltage capacitor not suitable for monolithic integration.

Various prior art capacitors have been employed to address the conflicting aspects of high-voltage capacitor realization in the context of CMOS ICs. For example, U.S. Pat. No. 6,137,153, entitled "Floating Gate Capacitor For Use In Voltage Regulators", issued to Le et al. describes a single floating-gate NMOS transistor used together with other circuitry as a constant-capacitance capacitor in a voltage-divider structure for voltage regulation, while U.S. Pat. No. 6,262,469, entitled "Capacitor For Use In A Capacitive Divider That Has A Floating-Gate Transistor As A Corresponding Capacitor" and issued to Le et al. describes one or more floating-gate NMOS transistors used together with other circuitry to provide a capacitive voltage divider for voltage regulation. These circuits are not intended to provide high-voltage capacitors; they also require a conventional control gate disposed atop the floating gate in order to operate, but the processing required to fabricate such control-gate structures is not available in many modern CMOS foundry processes.

One approach that has been employed to address these conflicting aspects of high-voltage capacitor realization in CMOS ICs is to stack a pair of FETs with source/drain contacts connected together, or a pair of MOS capacitors, in series by forming each capacitor structure so that they share a contact in the form of a well of semiconductive material. FIG. 2 is an exemplary schematic diagram of a high-voltage capacitor 200 formed from two MOS capacitor structures 205 and 210, in accordance with the prior art. For example, U.S. Pat. No. 5,926,064, entitled "Floating Gate MOS Capacitor" and issued to Hariton describes a voltage-independent capacitor circuit analogous to that of FIG. 2 and describes the associated biasing circuitry required for such.

Each of the MOS capacitor structures 205 and 210 of FIG. 2 is illustrated as comprising a PMOS FET-like structure having a respective externally accessible capacitor electrode 212, 214, a floating gate 231 and control electrode 232, source/drain electrodes or power electrodes 215, a channel 220 electrically coupling the source/drain electrodes 215 of each structure 205 or 210, and a body or well contact 225. In each of the structures 205 or 210, the gate structure includes a dielectric 230 such as a conventional gate oxide, and is capacitively coupled to the source/drain electrodes 215 and channel 220 through the dielectric 230.

Each FET structure 205, 210 is shown as comprising a floating-gate electrode 231 formed on a first portion of the dielectric layer 230 and a control-gate electrode, 232, formed on and separated from the floating-gate electrode 231 by a second portion of the dielectric layer 230. Conventional floating-gate transistors incorporate separate floating gate 231 and control gate 232 structures, with only the control gate 232 typically being electrically accessible.

A conventional stacked capacitor 200 is formed by interconnecting one of the source/drain contacts 215 from each of the FETs at a common intercapacitor node 235 and employing the control-gate electrodes 212 and 214, respectively, as the first 115 and second 125 capacitor electrodes (FIG. 1). One issue with such stacked capacitors 200 is that conventional MOS or floating-gate transistor structures have no means for adjusting charge on common node 235, and, consequently, are unable to avoid one of the two structures 205, 210 carrying a disproportionate amount of the voltage impressed across the electrodes 212, 214.

Furthermore, the semiconductive structure forming the common source/drain region has leakage currents associated with it. As a result, a bias circuit (not illustrated) is required in order to maintain the intercapacitor node 235 voltage and to provide a path for addition or removal of charge caused by leakage currents. Requiring such bias circuitry for each high-voltage capacitor 200 undesirably increases the complexity of the resulting integrated circuit that includes the high-voltage capacitors 200 and results in poorer form factor, i.e., a larger circuit layout.

Accordingly, improved techniques and structures are needed for realizing high-voltage capacitors having a compact form factor using standard CMOS processes.

SUMMARY

An architecture and methodology for provision of high-voltage stacked MOS or MDS capacitors that may be realized using standard CMOS-type processing is described. In one aspect, such a stacked capacitor includes a first capacitor and a second capacitor. Each capacitor includes a first plate comprising a first semiconductive body and a second plate comprising a first floating electrode. The first and second semiconductive bodies are electrically isolated from each other. The first and second floating electrodes are connected together at an intercapacitor node configured to self-adjust to about one-half of a working voltage impressed on the stacked capacitor.

BRIEF DESCRIPTION OF THE CONTENTS

DETAILED DESCRIPTION

The following disclosure describes simplified high-voltage stacked capacitors that may be realized using standard CMOS processes. The ability to form the stacked capacitors using standard CMOS processing techniques facilitates fabrication and integration of the resulting stacked capacitors together with other circuit elements and allows broader choice of foundries for such fabrication. This is particularly helpful for realizing CMOS devices having need for some amount of high-voltage circuitry. Enabling use of standard processing reduces complications in process implementation and on human-centric operations that would otherwise be involved in developing and calibrating non-standard processes, thereby reducing costs and the likelihood of human error.

Overview Of Stacked-Capacitor Architecture

Prior to describing various embodiments, the following section addresses an overview of an architecture for realization of improved high-voltage stacked floating-electrode capacitor structures. These may be needed for particular areas within a CMOS device. For example, in standard CMOS devices, a power supply voltage of 3.3 volts may be available. Most of the devices incorporated therein will be designed for this voltage but may not operate reliably at higher voltages. However, there may be a need in some areas of the IC for higher voltages such as 6 to 8 volts. For example, such may be desirable for programming certain types of nonvolatile memories. The architecture of the stacked high-voltage capacitor of FIG. 3 facilitates realization of such circuits, among others, and provides a framework within which various embodiments can be developed.

Figure 3:
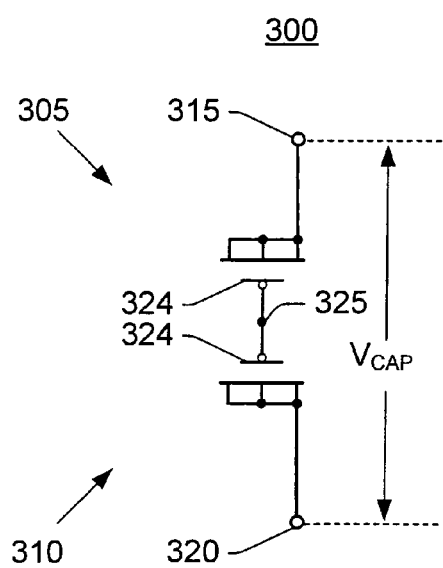
FIG. 3 is an exemplary schematic diagram of an embodiment of a stacked high-voltage capacitor that is compatible with conventional CMOS-type processes.

FIG. 3 is an exemplary schematic diagram of an embodiment of a stacked high-voltage capacitor 300 that is compatible with formation via conventional CMOS processes. In one embodiment, the stacked capacitor 300 is formed from a first capacitor 305 and a second capacitor 310, each shown as a PMOS FET-like structure with source, drain and body contacts shorted together, although any MOS-like capacitor structures using floating gates, including NMOS FET-like structures, may be employed.

The first capacitor 305 is shown as a PMOS FET-like structure with source/drain and body electrodes coupled together to form a first capacitor electrode 315 providing electrical contact to a first capacitor plate of the first capacitor 305. The second capacitor 310 is shown as a PMOS FET-like structure with source/drain and body electrodes coupled together to form a second capacitor electrode 320 providing electrical contact to a first capacitor plate of the second capacitor 310. As used herein, the terms "FET-like" and/or "FET-type" are defined to mean a semiconductive body and including at least one contact node, a dielectric disposed over at least a portion of a surface of the semiconductive body and a conductive electrode disposed over at least some of the dielectric.

Floating electrodes 324 formed from conductive material, such as p-type or n-type polysilicon and/or a metal such as aluminum, provide second plates of the first and second capacitors 305, 310 and are electrically connected together at a common intercapacitor node 325. The floating electrodes 324 of the first and second capacitors 305, 310 may comprise the same material or different materials coupled together via a conductive or ohmic interconnection. As used herein, the term "floating electrode" is defined to mean an electrode that is separated from a conductive or semiconductive body by an intervening dielectric having thickness and other properties consistent with tunneling of charge carriers between the floating electrode and the semiconductive body, in contrast to conventional floating-gate memory transistors, which employ a floating gate together with a control gate, rather than a floating electrode sans control gate.

Conventional floating-gate memory transistors typically require a control gate stacked on a floating gate and separated therefrom by a relatively thick dielectric, and typically require a voltage directly impressed upon the control gate to initiate tunneling of charge carriers to the floating gate from a channel of the memory transistor (or vice versa) via a relatively thin dielectric separating the floating gate from the channel. In contrast, in the stacked-capacitor floating-electrode devices described herein, one FET-like structure acts as a control gate for the other, and vice-versa, and tunneling can occur in either of the two FET-like structures (by reasons of symmetry) depending on the relative potentials of electrodes 315 and 320 and intercapacitor node 325.

The stacked capacitors described herein may be realized using technology similar to that of synapse transistors as described, for example, in U.S. Pat. Nos. 5,627,392; 5,825,063; 5,898,613; and 5,990,512 to Diorio et al., which patents are hereby incorporated herein by reference in their entirety.

In the stacked capacitor 300 of FIG. 3, the floating electrodes 324 may be charged or discharged via any of several mechanisms, such as Fowler-Nordheim tunneling, Frenkel-Poole tunneling, direct tunneling, or injection of electrons from the semiconductor body.

In one embodiment, with stacked capacitors as described herein, these charging and discharging mechanisms may allow the voltage on the intercapacitor node 325 to be self-adjusting. In other words, when a high voltage $V_{CAP}$ is applied across the first 315 and second 320 electrodes, there may initially be a disproportionate voltage drop across one or the other of the capacitors 305 and 310, due to any of a variety of causes, such as differences in capacitance between them, or to the initial charge state on floating node 325.

In response to such an applied voltage $V_{CAP}$, charge carriers may tunnel through one of the capacitor dielectrics such that, at equilibrium, any substantial imbalance in the voltage drop across the capacitors 305, 310 is reduced, and ideally each capacitor 305, 310 bears approximately one-half of the voltage $V_{CAP}$, or $V_{CAP}/2$. As a result, the stacked capacitor 300 is relatively robust, because neither of the capacitors 305, 310 is required to maintain a disproportionate amount of the voltage $V_{CAP}$ that is impressed on the capacitor 300 once the capacitor 300 has equilibrated. Further, once the capacitor 300 has equilibrated, the charge is stored on the floating gates 324 while the voltage $V_{CAP}$ is present and for some time thereafter, with the result that very little further charge tunneling/injection is required.

In other words, the intercapacitor node 325 self-adjusts to a voltage in-between that impressed on electrodes 315, 320 of the stacked capacitor 300, and will tend to equilibrate to a voltage that is about or near one half of a working voltage $V_{CAP}$ impressed on the stacked capacitor 300. A benefit associated with such a self-equilibrating structure is that the breakdown voltage for the stacked capacitor structure 300, assuming equal breakdown voltages and capacitances for each of the capacitors 305, 310, is maximized when half of the total voltage $V_{CAP}$ is applied across each of the capacitors 305 and 310.

Figure 9:
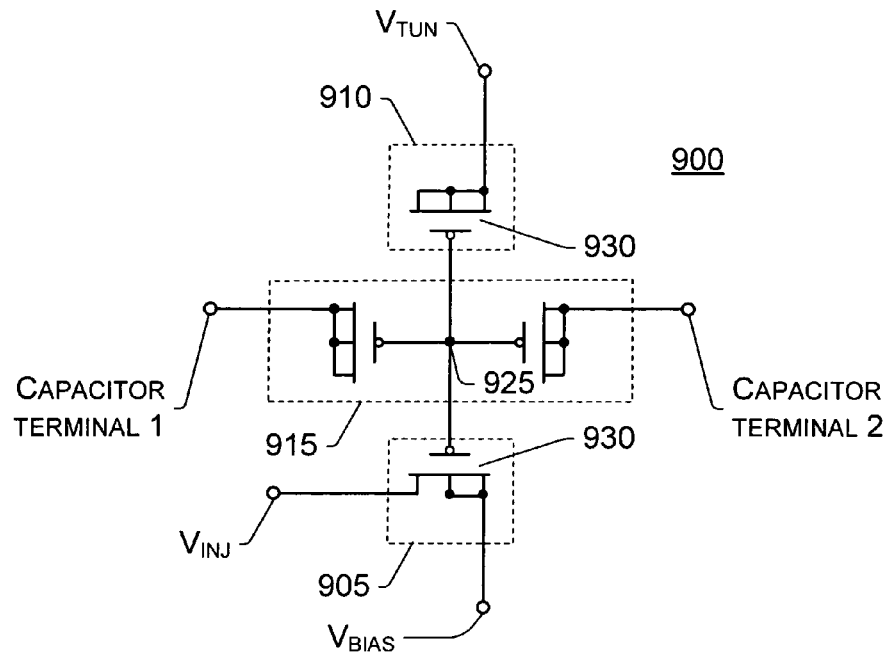
FIG. 9 is a schematic diagram of a stacked high-voltage capacitor incorporating a charge injector and a charge drain.

In one embodiment, the voltage on the intercapacitor node 325 may be programmed with a charge-injection circuit, as is described in more detail with respect to FIG. 9, infra, and in commonly assigned co-pending U.S. patent application Ser. No. 10/143,557, filed on May 9, 2002, entitled "Metal Dielectric Semiconductor Floating Gate Variable Capacitor", naming J. Hyde and Y. Ma as inventors, which is hereby incorporated herein by reference. Use of charge injection and adjustment circuits can permit the intercapacitor node voltage to be set to an appropriate value, even when the intercapacitor node value is not able to self-adjust to such voltages in normal circuit operation.

Empirical studies show that forming the capacitors as PMOS FET-like structures using p-type polysilicon floating electrodes can provide markedly longer storage times for charge stored on floating gates than, for example, NMOS FET-like structures. Observations of differences in charge-storage times indicate that PMOS-type structures are capable of storing charge for up to $10^4$ times longer than comparable NMOS-type structures. Exemplary storage times for PMOS-type structures with 7 nm (nanometer) thick oxides may be on the order of ten years, with 5 nm oxides providing storage times of from hours to days and with 3 nm oxide dielectrics providing storage times of seconds to minutes, however, it will be realized that such storage times may be highly implementation-dependent.

EMBODIMENTS

Figure 4:
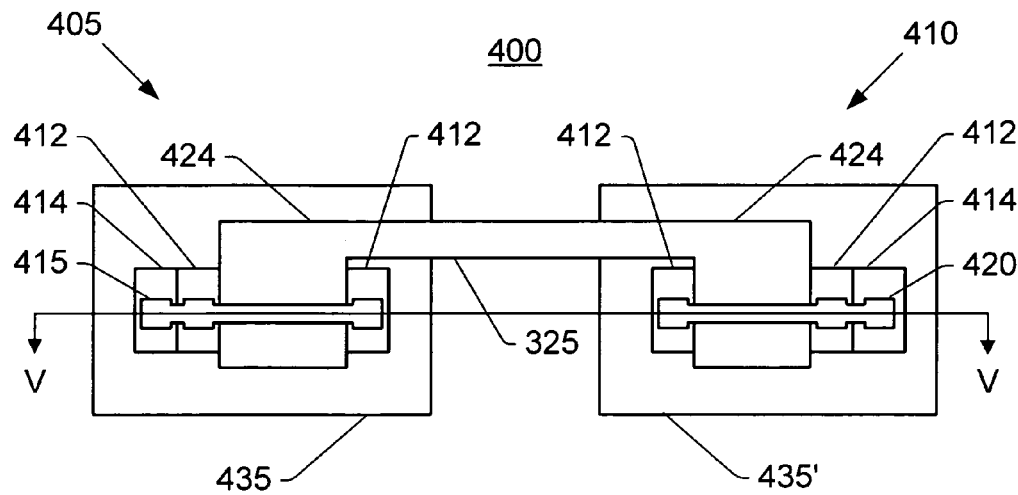
FIG. 4 is an exemplary plan view of an embodiment of the stacked high-voltage capacitor of FIG. 3.
Figure 5:
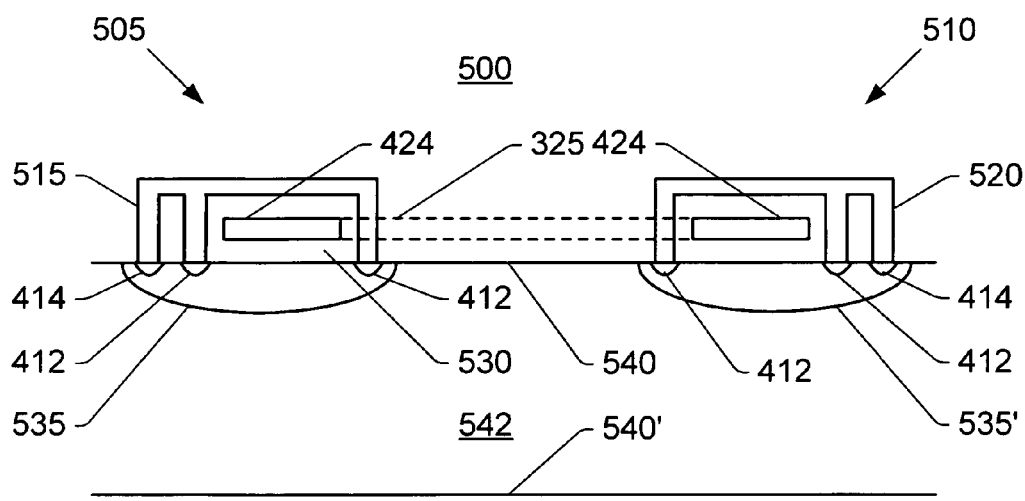
FIG. 5 is a side view, in section, taken along section lines V—V of FIG. 4, of an embodiment of the stacked high-voltage capacitor of FIGS. 3 and 4.

FIG. 4 is an exemplary plan view of an embodiment 400 of the stacked high-voltage capacitor 300 of FIG. 3, and FIG. 5 is a side view, in section, taken along section lines V—V of FIG. 4, of an embodiment 500 of the stacked high-voltage capacitor 300 of FIGS. 3 and 4. FIG. 4 shows a first capacitor 405 and a second capacitor 410. The first 405 and second 410 capacitors may be formed alike, as illustrated, or may be formed differently, as will be discussed in more detail below.

In one embodiment, the first capacitor 405 includes at least one first node 412, an optional second node 414, a conductor 415 contacting and/or interconnecting the first node(s) 412 and the second node 414 and forming a first electrode 415 of the stacked capacitor 400 (analogous to the first capacitor electrode 315 of FIG. 3). A conductor 420 forms a second electrode 420 of the stacked capacitor 400 on the second capacitor 410 and establishes electrical contact with at least one node 412 and may make electrical contact with the node 414 if such is included.

Figure 1:
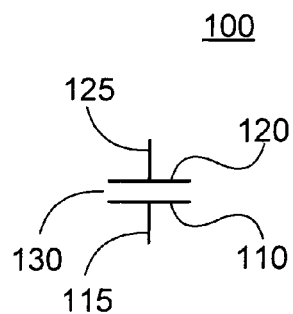
FIG. 1 is an exemplary schematic diagram of a conventional capacitor.
Figure 2:
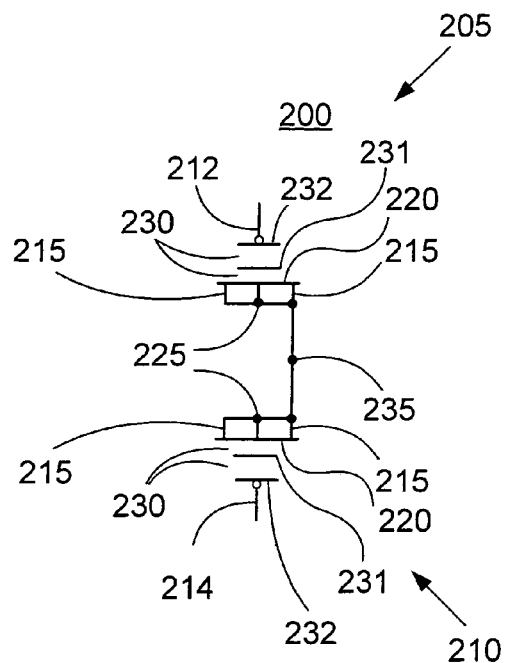
FIG. 2 is an exemplary schematic diagram of a conventional stacked high-voltage capacitor formed from two MOS capacitor structures.

A floating electrode 424 forms one electrode of each of the first and second capacitors 405 and 410 and a portion 325 thereof also extends between the first and second capacitors 405 and 410 (as represented by dashed lines in FIG. 5). This portion 325 also acts as the intercapacitor node 325 (as in FIG. 3). Each of the capacitors 405, 410 is formed in a body of semiconductive material 435, 435', with the bodies of semiconductive material 435, 435' being electrically isolated from each other, in contrast to conventional stacked MOS capacitors as in FIG. 2.

In one embodiment, the first capacitor 405 is formed from a PMOS FET-like structure having heavily doped source/drain nodes 412 comprising p+ regions each disposed in a respective body of moderately doped n-type semiconductive material 435, 435' and each such body 435, 435' optionally includes a heavily doped n+ region 414 as a body contact. Exemplary moderately doped levels for the bodies 435, 435' are in a range of from $10^{16}/cm^3$ to $10^{19}/cm^3$, while exemplary heavily doped levels for the p+ 412 and n+ 414 nodes are in a range of from $10^{19}/cm^3$ to $5 \times 10^{20}/cm^3$, although it will be appreciated that higher or lower doping levels may be employed.

In another embodiment, the p+ regions 412 are omitted and the n+ regions 414 supply contact for the first and second electrodes 415, 420. Alternatively, the semiconductor bodies 435, 435' may be p-type, with either p+ contacts 412 and/or n+contacts 414. The semiconductor bodies 435, 435' may be formed of the same or of different conductivity types (i.e. p-p, p-n, n-p, or n-n), and may be formed on semiconductive or insulative substrates.

FIG. 5 is a side view, in section, taken along section lines V—V of FIG. 4, of an embodiment 500 of the stacked high-voltage capacitor 300, 400 of FIGS. 3 and 4, respectively. In the embodiment shown in FIG. 5, the capacitors 505 and 510 employ interconnections 515 and 520, respectively, analogous to the first and second electrodes 415, 420 of FIG. 4. A dielectric layer 530 is formed atop bodies of semiconductive material 535, 535' formed at a top surface 540 (opposite a bottom surface 540') of a substrate 542.

In one embodiment, the bodies of n-type material 435, 435' of FIG. 4 comprise n-wells 535, 535' (FIG. 5) disposed in a p-type semiconductor or insulating substrate 542. The nodes 412 and/or 414 and the n-wells may be doped as described above, while an exemplary p-type substrate doping is in a range of from about $10^{15}/cm^3$ to about $10^{16}/cm^3$, although it will be appreciated that higher or lower doping levels may be employed. The dielectric layer 530 is disposed between the floating electrode 424 as well as the intercapacitor node 325 and portions of the top surface 540 that include the n-wells 535, 535'. It will be appreciated that the bodies 535, 535' may comprise p-wells formed in a n-type or an insulating substrate 542. In one embodiment, one of the bodies 535, 535' may be of an opposite conductivity type from another of the bodies 535, 535' and the bodies may be isolated from one another and/or the substrate by p-n junctions or insulators.

The dielectric layer 530 may have a thickness in a range of from about 50 nm to about 2 nm. In one embodiment, the dielectric layer 530 may have a thickness chosen in accordance with the storage times discussed above with reference to the overview discussion associated with FIG. 3.

The dielectric layer 530 may be formed from silicon dioxide. Alternatively, the dielectric layer 530 may be formed from one or more materials chosen from a group including nitrided oxide, nitride, oxide/nitride composition, titanium oxide, tantalum oxide, zirconium oxide, hafnium oxide, lanthanum oxide (or any oxide of a lanthanide), titanium silicate, tantalum silicate, zirconium silicate, hafnium silicate and lanthanum silicate (or any silicate of a lanthanide), any combination of such dielectrics or from other insulating materials.

With any of these or other dielectric materials, thinner dielectric layers 530 provide more capacitance per unit area but also provide lower breakdown voltages, and vice versa for thicker dielectric layers 530. These alternative dielectrics generally provide higher dielectric constants and can therefore be utilized in thicker layers than silicon dioxide.

The substrate 542 may be formed from semiconductive material, such as bulk monocrystalline silicon, or may include an insulator (e.g., silicon on insulator; silicon on sapphire; wafer bonded structures) or the devices may be formed as TFTs (thin film transistors formed on an insulative substrate) or as FinFETs (vertical FETs formed on ridges of semiconductive material with the gates disposed on one or both sides of the ridges), or as other lateral or vertical FET-like structures.

Figure 6:
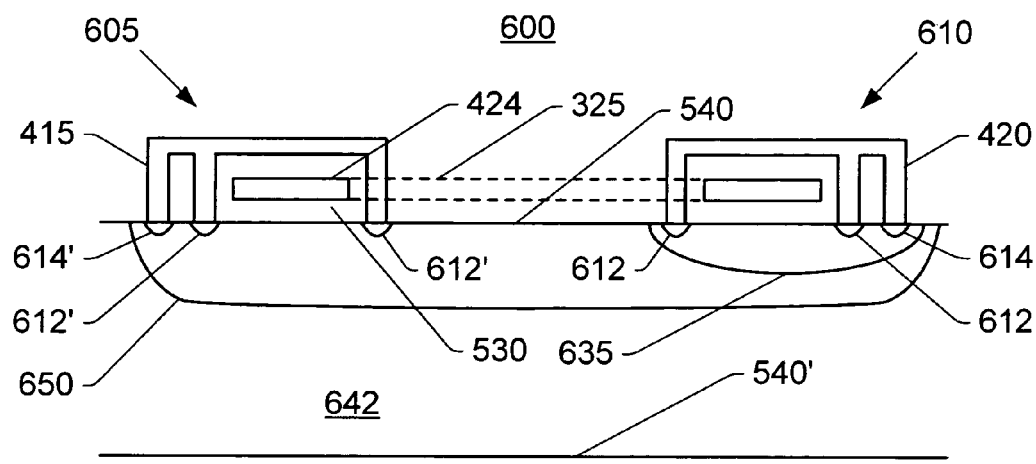
FIG. 6 is a side view, in section, analogous to that of FIG. 5, of an embodiment of the stacked high-voltage capacitor of FIGS. 3 and 4.

FIG. 6 is a side view, in section, analogous to that of FIG. 5, of an embodiment 600 of the stacked high-voltage capacitor of FIGS. 3 and 4. FIG. 6 shows a first capacitor structure 605 and a second capacitor structure 610. The second capacitor structure 610 is formed in a well of semiconductive material 635, analogous to the wells 535 of FIG. 5, but formed within a second well of semiconductive material 650. The first capacitor structure 605 is formed in the well 650 but outside of the region corresponding to the well 635. The well 650 is of an opposite conductivity type to the well 635 and is also of an opposite conductivity type to the substrate 642 (or substrate 642 may be insulating).

In one embodiment, the well 635 is a p-doped region, the contact(s) 612 are n+contacts and the body contact 614 is a p+ contact. The capacitor structure 610 is thus analogous to a NMOS FET or capacitor. The well 650 may be a deep n-well, with the contact(s) 612' being p+ contacts and the optional body contact 614' being an n+ contact. The substrate 642 is p– doped or insulating. In this embodiment, the parasitic p-n junctions formed between the p-well 635 and the deep n-well 650, and between the deep n-well 650 and the substrate 642, should both be reversed biased for appropriate operation.

In other words, a bias voltage applied to the deep n-well 650 should be greater than or at least equal to a bias voltage applied to the p-substrate 642, and a bias voltage applied to the deep n-well should also be greater than or at least equal to the bias voltage applied to the p-well 635. Accordingly, capacitor structure 605 should be "on top" in a voltage sense, that is, electrode 415 of capacitor structure 605 should not be at a lower potential than electrode 420 of capacitor structure 610.

Put another way, the capacitor structure 610 should be "on the bottom" in a voltage sense, and the body (p-well 635) of capacitor structure 610 may be biased to a voltage below that of the substrate 642 (i.e., may be biased to a voltage more negative than ground). These bias voltages are readily provided using conventional circuits and techniques.

Figure 7:
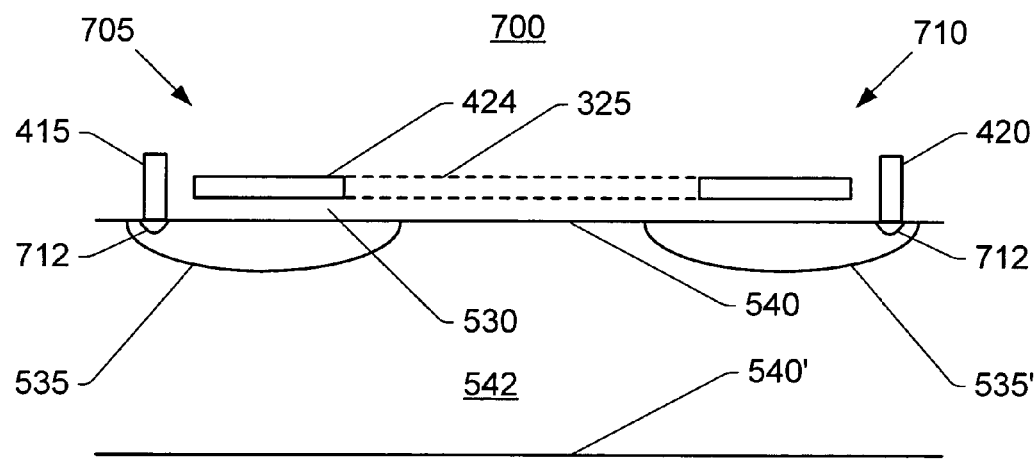
FIG. 7 is a side view, in section, analogous to that of FIG. 5, of an embodiment of the stacked high-voltage capacitor of FIGS. 3 and 4.

FIG. 7 is a side view, in section, analogous to that of FIG. 5, of an embodiment 700 of the stacked high-voltage capacitor of FIGS. 3 and 4. FIG. 7 shows a first capacitor structure 705 and a second capacitor structure 710, each formed on an individual body of semiconductive material 535, 535'. In one embodiment, such comprises n-wells 535, 535' formed in a p-type substrate 542 together with a p+ or n+contact 712 as described above. However, it will be appreciated that other types of substrates and semiconductor bodies may be employed.

When the semiconductor material 535, 535' is n-type, n+ contacts 712 may be appropriate. When the semiconductor material 535, 535' is p-type, p+ contacts 712 may be appropriate. These semiconductor type and contact type may be the same or different for the capacitors 705 and 710.

In any case, the contact 712 of the capacitor 705 is coupled to the terminal 415 and the contact 712 of the capacitor 710 is coupled to the terminal 420. Adding additional optional n+ and/or p+ contacts to the structure 700 causes the structure 700 to more nearly resemble the structure 500 of FIG. 5. Similarly, removal of portions of the structure 500 of FIG. 5 causes such to more nearly resemble the structure 700 of FIG. 7.

It will be apparent to those of skill in the art that the various embodiments described herein may be combined in numerous ways to realize stacked capacitors. For example, NMOS FET-type and PMOS FET-type, NMOS or PMOS-type capacitors, or accumulation mode and inversion mode structures (or admixtures thereof) may be combined in series or in parallel to provide a desired result.

Exemplary Self-Adjustment of the Floating-Gate Charge

Figure 8A:
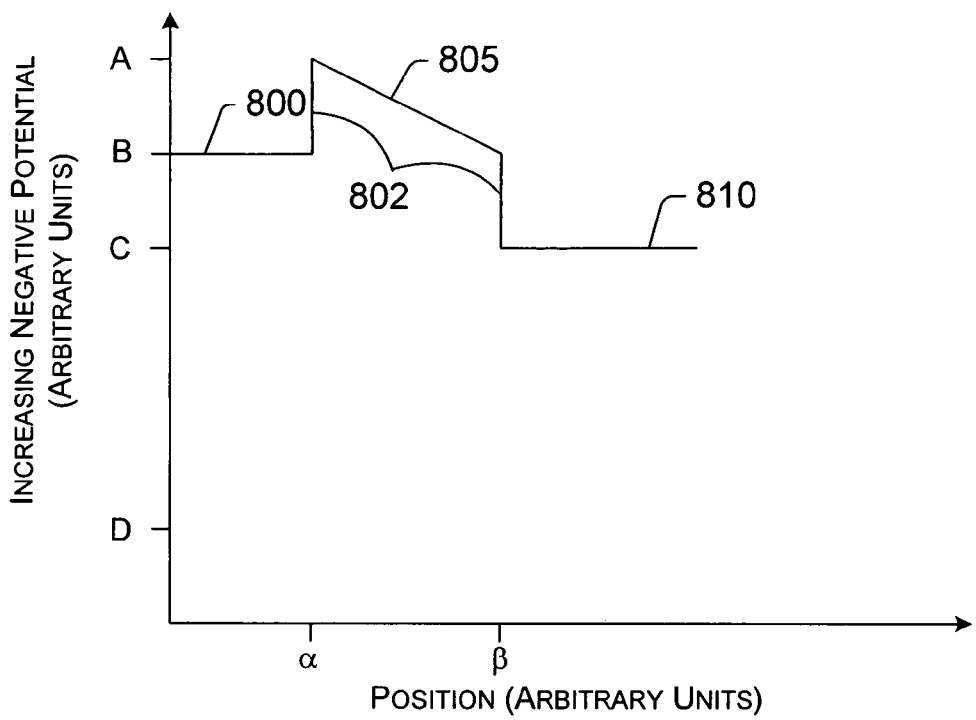
FIGS. 8A and 8B are band diagrams reflecting different bias and tunneling conditions relative to the embodiments of FIGS. 3–7.
Figure 8B:
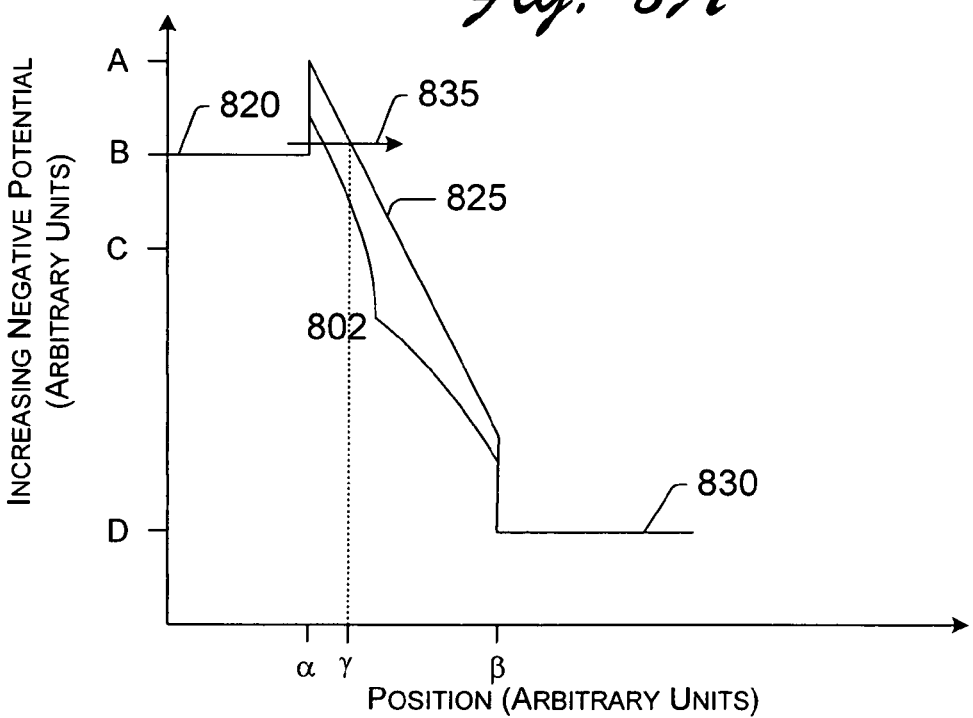

FIGS. 8A and 8B are band diagrams reflecting different bias and tunneling conditions relative to the embodiments of FIGS. 3–7. In FIGS. 8A and 8B, the ordinate corresponds to increasing negative potential while the abscissa corresponds to position. For example, potentials A–D represent increasing positive potentials, such as −3.1, 0, 3.1 and 10 volts, respectively, while position α corresponds to a portion of the high-voltage capacitor (e.g., 305, FIG. 3) beneath the gate dielectric and floating gate 324, such as the channel of a FET forming a high-voltage capacitor or the body of the high-voltage capacitor, and position β corresponds to the floating-gate electrode (e.g., 324, FIG. 3). The region between α and β corresponds to a dielectric (e.g. 530, FIG. 5).

FIG. 8A depicts a bias scenario where relatively little tunneling occurs, and illustrates portions 800, 802, 805 and 810 of a curve describing electrical potential. The portion 800 of the potential curve, corresponding to the conduction band of the body or channel, is at potential B; the portion 805 corresponds to the conduction band of the dielectric; the portions 802 correspond to the forbidden gap of the dielectric; while a portion 810, corresponding to the floating electrode, is at potential C. The portion between 800 and 805, corresponding to positions B and A on the ordinate, respectively, represents a potential barrier to the conduction of charge carriers, such as electrons, from the channel or body 800 to the floating electrode 810. The portion between 800 and 810, corresponding to the positions α and β, on the abscissa, represents a potential barrier to tunneling of charge carriers, such as electrons, from the channel or body 800 to the floating electrode 810.

FIG. 8B depicts a bias scenario favorable to increased tunneling of charge carriers. A portion 820 of the potential curve, analogous to the portion 800, is at potential B, while a portion 830 is at potential D. As a result, the portion 825 has a much steeper slope than the corresponding portion 805 of FIG. 8A. In turn, the thinned extent of the forbidden gap comprising the leftmost portion 802 (position α) and the corresponding portion of the curve 825 (position γ) facilitates tunneling of charge carriers through the forbidden gap to a location and potential such as position γ of the curve 825 at the potential C (the tunneling typically represented as shown by arrow 835), followed by acceleration towards the portion 830.

Electron conduction (via tunneling) from channel or body 820 to floating gate 830 decreases the electrostatic potential of floating gate 830. Such causes the potential on the floating gate 324 to adjust to a value such that the overall shape of the potential curve becomes sufficiently like the shape of the potential curve of FIG. 8A that tunneling is less probable. In practice, the potential may continue to self-adjust but progressively (e.g., exponentially) more slowly. This self-adjustment process may take place in either capacitor 305 or 310 until the potential of intercapacitor node 325 self-adjusts to levels where further tunneling in capacitor 305 or 310 is less and less likely. While the example of FIGS. 8A and 8B depicts a scenario corresponding to Fowler-Nordheim tunneling, it will be apparent to those of skill in the art that similar self-adjustment can take place with other mechanisms such as Frenkel-Poole tunneling or direct tunneling. It will also be apparent that the self-adjustment process can take place when either capacitor 305 has a larger voltage across it than capacitor 310, or vice versa, the self-adjustment process acting to adjust the charge on intercapacitor node 325 and thereby decrease the voltage across capacitor 305 and increase that across capacitor 310, or vice versa. Finally, it will be apparent, by reasons of symmetry, that charge carriers such as electrons can tunnel in the opposite direction, from floating gate to channel or body, rather than from channel or body to floating gate, under appropriate bias conditions.

It will be apparent to those of ordinary skill in the art that charge need not transfer all the way from channel or body to floating gate (or vice versa), but, rather, can equalize the voltage across capacitors 305, 310 by accumulating in dielectric layer 530. One example is SONOS devices (silicon-oxide-nitride-oxide-silicon structures) in which injected charge is trapped in an insulative nitride layer sandwiched between oxide layers.

Exemplary Charge Injection/Removal Circuit

FIG. 9 is a schematic diagram of a high-voltage capacitor circuit 900 incorporating a charge injector 905 and a charge drain 910. In one embodiment, stacked capacitor 915 includes a common node 925 comprising a floating gate, as described above, and is coupled to the charge injector 905 and to the charge drain 910.

In one embodiment, the devices forming the charge injector 905, the charge drain 910 and the stacked capacitor 915 all share a common floating gate 925, which may be formed from a metal or from p- or n-type polysilicon. In one embodiment, the structures making up the capacitors in the stacked capacitor 915 each have a relatively large area (e.g., 9 μm×9 μm) while the structures forming the charge injector 905 and the charge drain 910 are substantially smaller (e.g., 0.24 μm×0.60 μm).

In one embodiment, the structures making up the capacitors in the stacked capacitor 915 have approximately the same area and approximately the same capacitance. In one embodiment, the structures forming the capacitors in the stacked capacitor 915 are substantially larger (e.g., 500×) than those forming either the charge injector 905 or the charge drain 910. Such can obviate effects on the capacitance of the stacked capacitor 915 arising from parasitic capacitance effects resulting from the charge injector 905 and the charge drain 910.

In one embodiment, the charge injector 905 may be formed as a FET having one electrode coupled to a voltage $V_{INJ}$, with the body and another electrode coupled to a voltage $V_{BIAS}$. A relatively large drain-to-source voltage, (e.g., $|V_{BIAS}-V_{INJ}|$ causes electrons (e.g., channel electrons in the case of an nFET, or secondary electrons generated by impact ionization in the case of a pFET) to inject onto the common electrode 925. In one embodiment, the FET is a p-channel MOSFET, $V_{BIAS}$ is about 3.3V, and $V_{INJ}$ is about −2.5V.

In one embodiment, the charge drain 910 may be formed as a shorted PFET-like structure in an n-well, i.e., much like structures described above with reference to 405 or 410 in FIG. 4. Application of a relatively large potential to the charge drain 910 allows charge carriers to tunnel from the floating electrode 925, through dielectric 930, to the charge drain 910. For example, a positive voltage $V_{TUN}$ may be applied to cause electrons to tunnel from the floating electrode 925 and thus increase the amount of charge stored in the stacked capacitor circuit 915.

Other charge injection and drain circuits analogous to the charge injector 905 and charge drain 910 of FIG. 9 may also be used to adjust the charge stored on floating gate 925 of stacked capacitor 915. Alternatively, two charge injectors (of opposing polarity) may be used in place of an injector a drain, or two charge drains (of opposing polarity) may be used in place of an injector a drain. It will be appreciated that the stacked capacitor 915 may need to be modified to provide appropriate biases in order to employ these alternative injection and drain circuits.

Exemplary Circuit Application

Figure 10:
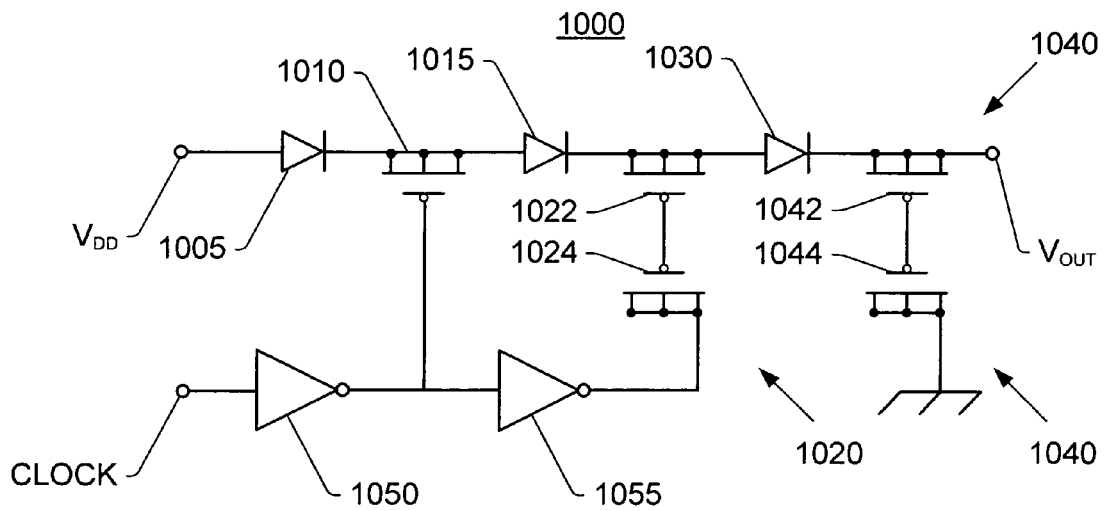
FIG. 10 is a schematic diagram of an exemplary voltage multiplier circuit advantageously employing the capacitor structures of any of FIGS. 3–7.

FIG. 10 is a schematic diagram of an exemplary voltage-multiplier circuit 1000 advantageously employing the capacitor structures of any of FIGS. 3–7. The voltage multiplier circuit 1000 acts to provide a high voltage $V_{OUT}$ such as about eight or more volts from a supply voltage $V_{DD}$ such as 3.3 volts and operates in response to a clock signal CLOCK.

The voltage multiplier circuit 1000 includes a first diode 1005 having an anode coupled to the supply voltage $V_{DD}$ and having a cathode. A first capacitor 1010, which may be formed from a FET (as illustrated) has power electrodes coupled to the cathode of the first diode and to an anode of a second diode 1015, and has a control electrode. The first capacitor 1010 need not be a high-voltage capacitor.

A cathode of the second diode 1015 is coupled to an electrode of a first stacked high-voltage capacitor 1020 formed from two capacitors 1022 and 1024. A third diode 1030 has an anode coupled to both the cathode of the second diode and to the first stacked high-voltage capacitor 1020. A cathode of the third diode 1030 is coupled to a second stacked high-voltage capacitor 1040 formed from two capacitors 1042 and 1044.

The clock signal CLOCK is buffered through a first inverter 1050 and causes the gate or control electrode of the first capacitor 1010 to alternately be grounded or be coupled to $V_{DD}$. When the gate is grounded, the first capacitor 1010 is charged to approximately $V_{DD}$ (assuming that the forward voltage drop across diode 1050 is small). When the gate or lower electrode is raised to $V_{DD}$ in response to a change in the clock signal, the FET body or upper capacitor electrode is then raised in voltage to approximately $2\times V_{DD}$, and cannot leak the charge Q back to the $V_{DD}$ supply because of the diode 1005.

At the same time, the clock signal is buffered through a second inverter 1055 such that the stacked capacitor 1020 comprising capacitors 1022 and 1024 has its lower electrode grounded. As a result, charge is dumped into the stacked capacitor 1020 from the first capacitor 1010, raising the voltage on the stacked capacitor 1020 to approximately $2\times V_{DD}$.

On a next clock signal transition, the lower electrode of the capacitor 1024 is raised to $V_{DD}$, with the result that the upper electrode of the stacked capacitor 1020 (the source/drain/well contacts of the capacitor 1022) is raised to a voltage approximately $3\times V_{DD}$ and dumps charge through diode 1030 into the stacked capacitor 1040 formed by capacitors 1042 and 1044. After several clock cycles, stacked capacitor 1040 is charged to approximately $3\times V_{DD}$. The associated intercapacitor nodes of stacked capacitors 1020 and 1040 likewise charge to values in-between the respective working voltages and ground, via the self-equilibration process described above.

As a result, the voltage $V_{OUT}$ is charged to approximately $3\times V_{DD}$, minus the forward voltage drops across the diodes 1005, 1015, and 1030, and other factors. Because the voltages sustained by the stacked capacitors 1020 and 1040 are greater than $V_{DD}$, these capacitors need to be high-voltage capacitors in order for the circuit 1000 to work reliably. The stacked capacitor structures described herein facilitate realization of high-voltage capacitors and may do so while being consistent with conventional CMOS processes.

CONCLUSION

The concepts described herein provide significant advantages compared to prior art high-voltage CMOS-compatible capacitors. The stacked floating-gate high-voltage capacitor structures do not require a control gate or the circuitry ordinarily associated therewith and do not require the biasing circuitry typically employed in conventional stacked capacitor structures. As a result, these floating-gate high-voltage capacitor structures require fewer processing operations to fabricate and thus are relatively robust in manufacturing. The capacitors described herein may incorporate an intercapacitor node that is self-adjusting with respect to a working voltage impressed across the stacked floating-gate high-voltage capacitor.

Additionally, the stacked floating-gate high-voltage capacitor stores charge from an initial adjustment of the intercapacitor floating node for relatively long periods of time, even in the absence of externally applied electrical signals. The stacked high-voltage capacitor may be employed in a configuration that does not require any electrical connection to the intercapacitor node other than that of the floating gates themselves, simplifying fabrication and operation of the resulting high-voltage capacitor structure.

Although the disclosed concepts have been described in language specific to structural features and/or methodological acts, it is to be understood that the subject matter defined in the appended claims is not necessarily limited to the specific features or acts described. Rather, the specific features and acts are disclosed as exemplary forms of implementing the claimed subject matter.

What is claimed is:

1. A stacked capacitor comprising:
a substrate; and
first and second capacitors each comprising;
an n-well formed in the substrate and comprising an electrode of the stacked capacitor, each n-well being isolated from the substrate;
a tunneling dielectric disposed atop each of the n-wells; and
a floating electrode comprising polysilicon disposed on the tunneling dielectric atop at least a portion of each of the n-wells and extending there between.

2. The stacked capacitor of claim 1, wherein the tunneling dielectric has a thickness of between 2 nm and 50 nm.

3. The stacked capacitor of claim 1, wherein the tunneling dielectric comprises silicon dioxide.

4. The stacked capacitor of claim 1, wherein the floating electrode is configured to self-adjust to a floating voltage whose value is less than a working voltage of the stacked capacitor and is configured to store the floating voltage when electrical power is removed from the stacked capacitor.

5. The stacked capacitor of claim 1, further comprising:
a charge injector coupled to the floating electrode; and
a charge drain coupled to the floating electrode, wherein the charge injector and charge drain are configured to adjust a floating voltage of the floating electrode to a value less than a working voltage of the stacked capacitor.

6. The stacked capacitor of claim 1, wherein at least one of the n-wells includes an n+ contact.

7. The stacked capacitor of claim 1, wherein at least one of the first and second capacitors is configured to operate in an inversion mode.

8. The stacked capacitor of claim 1, wherein at least one of the first and second capacitors is configured to operate in an accumulation mode.

9. The stacked capacitor of claim 1, wherein at least one of the n-wells includes a p+ implant.

10. The stacked capacitor of claim 1, wherein the substrate comprises a p-type silicon substrate.

11. A stacked capacitor comprising:
a substrate; and
first and second capacitors each comprising:
a semiconductive well supported by the substrate and comprising an electrode of the stacked capacitor, each well being electrically isolated from the substrate and from each other;
a tunneling dielectric disposed atop each of the wells; and
a floating electrode comprising polysilicon disposed on the tunneling dielectric atop at least a portion of each of the wells and extending there between.

12. The stacked capacitor of claim 11, wherein the tunneling dielectric has a thickness of between 2 nm and 50 nm.

13. The stacked capacitor of claim 11, wherein the tunneling dielectric comprises silicon dioxide.

14. The stacked capacitor of claim 11, wherein the floating electrode is configured to self-adjust to a floating voltage whose value is less than a working voltage of the stacked capacitor.

15. The stacked capacitor of claim 11, further comprising:
a charge injector coupled to the floating electrode; and
a charge drain coupled to the floating electrode, wherein the charge injector and charge drain are configured to adjust a floating voltage of the floating electrode to a value less than a working voltage of the stacked capacitor.

16. The stacked capacitor of claim 11, wherein the floating electrode is configured to store a floating voltage when electrical power is removed from the stacked capacitor.

17. The stacked capacitor of claim 11, wherein at least one of the wells comprises an n-well.

18. The stacked capacitor of claim 11, wherein at least one of the wells includes an n+ contact.

19. The stacked capacitor of claim 11, wherein at least one of the wells comprises a p-well.

20. The stacked capacitor of claim 11, wherein at least one of the wells includes a p+ contact.

21. The stacked capacitor of claim 11, wherein at least one of the first and second capacitors is configured to operate in an inversion mode.

22. The stacked capacitor of claim 11, wherein at least one of the first and second capacitors is configured to operate in an accumulation mode.

23. The stacked capacitor of claim 11, wherein the substrate comprises p-type silicon.

24. The stacked capacitor of claim 11, wherein the substrate comprises n-type silicon.

25. A stacked capacitor comprising:
first and second capacitor means sharing a common floating electrode; and
charge injection and extraction means coupled to the first and second capacitor means and configured to set a voltage of the common floating electrode to a value less than a working voltage of the stacked capacitor.

26. The stacked capacitor of claim 25, wherein the first and second capacitor means comprise FET-type structures.

27. The stacked capacitor of claim 25, wherein the first and second capacitor means comprise MOS-type capacitor structures.

28. The stacked capacitor of claim 25, wherein the first and second capacitor means comprise bodies of semiconductive material tat are electrically isolated from each other.

29. The stacked capacitor of claim 25, wherein the charge injection and extraction means comprises a tunneling oxide disposed adjacent the common floating electrode.

30. The stacked capacitor of claim 25, wherein the common floating electrode comprises polysilicon.

31. The stacked capacitor of claim 25, wherein to first and second capacitor means comprise bodies of semiconductive material tat are electrically isolated from each other, the charge injection and extraction means comprises a tunneling oxide disposed between each of the bodies of semiconductive material and the common floating electrode, and wherein the common floating electrode comprises polysilicon.

32. The stacked capacitor of claim 25, wherein the charge injection and extraction means comprise;
a charge injector coupled to the floating electrode; and
a charge drain coupled to the floating electrode, wherein the charge injector and charge drain are configured to adjust the voltage of the common floating electrode.

33. The stacked capacitor of claim 25, wherein the floating electrode is configured to store the voltage on the common floating electrode when electrical power is removed from the stacked capacitor.

* * * * *

UNITED STATES PATENT AND TRADEMARK OFFICE
CERTIFICATE OF CORRECTION

| | | |
|---|---|---|
| PATENT NO. | : 7,071,507 B2 | Page 1 of 1 |
| APPLICATION NO. | : 10/931583 | |
| DATED | : July 4, 2006 | |
| INVENTOR(S) | : Christophre J. Diorio et al. | |

It is certified that error appears in the above-identified patent and that said Letters Patent is hereby corrected as shown below:

Column 13, Line 12: "and extending there between" should read --and extending therebetween--

Column 14, Line 46: "wherein to first" should read --wherein the first--

Column 14, Line 48: "material tat are" should read --material that are--

Signed and Sealed this

Twenty-eighth Day of November, 2006

JON W. DUDAS
*Director of the United States Patent and Trademark Office*

UNITED STATES PATENT AND TRADEMARK OFFICE
CERTIFICATE OF CORRECTION

PATENT NO. : 7,071,507 B2  Page 1 of 1
APPLICATION NO. : 10/931583
DATED : July 4, 2006
INVENTOR(S) : Diorio et al.

It is certified that error appears in the above-identified patent and that said Letters Patent is hereby corrected as shown below:

In column 7, line 35, delete "n+contacts" and insert -- n+ contacts --, therefor.

In column 7, line 59, delete "a" and insert -- an --, therefor.

In column 8, line 41, delete "n+contacts" and insert -- n+ contacts --, therefor.

In column 9, line 5, delete "n+contact" and insert -- n+ contact --, therefor.

In column 13, line 4, in Claim 1, delete "comprising;" and insert -- comprising: --, therefor.

In column 13, line 12, in Claim 1, delete "there between." and insert -- therebetween. --, therefor.

In column 13, line 51, in Claim 11, delete "there between." and insert -- therebetween. --, therefor.

In column 14, line 40, in Claim 28, delete "tat" and insert -- thats --, therefor.

In column 14, line 46, in Claim 31, delete "to" and insert -- the --, therefor.

In column 14, line 48, in Claim 31, delete "tat" and insert -- that --, therefor.

In column 14, line 55, in Claim 32, delete "comprising;" and insert -- comprising: --, therefor.

Signed and Sealed this

Third Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,071,507 B2  Page 1 of 1
APPLICATION NO. : 10/931583
DATED : July 4, 2006
INVENTOR(S) : Diorio et al.

It is certified that error appears in the above-identified patent and that said Letters Patent is hereby corrected as shown below:

In column 7, line 35, delete "n+contacts" and insert -- n+ contacts --, therefor.

In column 7, line 59, delete "a" and insert -- an --, therefor.

In column 8, line 41, delete "n+contacts" and insert -- n+ contacts --, therefor.

In column 9, line 5, delete "n+contact" and insert -- n+ contact --, therefor.

In column 13, line 4, in Claim 1, delete "comprising;" and insert -- comprising: --, therefor.

In column 13, line 12, in Claim 1, delete "there between." and insert -- therebetween. --, therefor.

In column 13, line 51, in Claim 11, delete "there between." and insert -- therebetween. --, therefor.

In column 14, line 40, in Claim 28, delete "tat" and insert -- thats --, therefor.

In column 14, line 46, in Claim 31, delete "to" and insert -- the --, therefor.

In column 14, line 48, in Claim 31, delete "tat" and insert -- that --, therefor.

In column 14, line 55, in Claim 32, delete "comprise;" and insert -- comprise: --, therefor.

Signed and Sealed this

Seventeenth Day of June, 2008

JON W. DUDAS
*Director of the United States Patent and Trademark Office*